(12) United States Patent
Yoshizawa

(10) Patent No.: US 6,717,538 B2
(45) Date of Patent: Apr. 6, 2004

(54) DA CONVERTER AND DATA REPRODUCING APPARATUS

(75) Inventor: Masayuki Yoshizawa, Fujino-machi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/286,420

(22) Filed: Oct. 31, 2002

(65) Prior Publication Data

US 2003/0090401 A1 May 15, 2003

(30) Foreign Application Priority Data

Oct. 31, 2001 (JP) .................................. 2001-334611
Oct. 23, 2002 (JP) .................................. 2002-308309

(51) Int. Cl.$^7$ .............................................. H03M 3/00
(52) U.S. Cl. ...................................... 341/143; 341/144
(58) Field of Search ................................ 341/143, 155, 341/144

(56) References Cited

U.S. PATENT DOCUMENTS 4,901,077 A * 2/1990 Christopher ................ 341/143
6,043,767 A * 3/2000 Wakamatsu ................. 341/139
6,072,843 A * 6/2000 Baker et al. ................. 375/340
6,223,080 B1 * 4/2001 Thompson ................... 607/16

FOREIGN PATENT DOCUMENTS

JP   2000-269436   9/2000   ........... H01L/27/04
JP   2001-102925   4/2001   ........... H03M/1/10

* cited by examiner

Primary Examiner—Peguy Jeanpierre
(74) Attorney, Agent, or Firm—Harness, Dickey & Pierce, P.L.C.

(57) ABSTRACT

A Δ·Σ type DA converter is provided with a digital circuit 21 including a PWM circuit 26 and an analog circuit 22, wherein in order to make an output of the analog circuit 22 a predetermined value, the analog circuit 22 is driven at a predetermined direct current voltage V1 (for instance, 5 V), and the digital circuit 21 is driven at a direct current voltage V2 (for instance, 3.3V) that is set lower than the direct current voltage V1. Since the digital circuit 21 and the analog circuit 22 are driven at different power supply voltages, a level shifter 23 is disposed at a boundary portion of the digital circuit 21 and the analog circuit 22, the level shifter 23 steps up a level of the PWM signal outputted from the PWM circuit 26.

9 Claims, 5 Drawing Sheets

(a) PWM WAVEFORM (b) ANALOG WAVEFORM

DA CONVERTER AND DATA REPRODUCING APPARATUS

BACKGROUND OF THE INVENTION

1. Technical Field to which the Invention Belongs

The present invention relates to a DA converter that converts a digital signal into an analog signal, and in particular to a delta sigma (hereinafter referred to as "Δ·Σ") type DA converter.

In addition, the present invention relates to data reproducing apparatus that utilizes the Δ·Σ type converter and reproduces an audio data of a recording medium such as a CD (compact disc).

2. Prior Art

Known DA converters include a digital circuit containing a PWM circuit, and an analog circuit that converts a PWM signal from the PWM circuit into an analog signal.

In such a DA converter, the same direct current voltage is supplied to the respective parts thereof as a power supply voltage, and the same direct current voltage drives the respective parts thereof.

However, in the existing DA converter, although a digital circuit and an analog circuit with different properties coexist, as mentioned above, both circuits are driven with the same direct current voltage. As a result, power consumption is more than necessary. Accordingly, there is a demand for reducing power consumption as a whole.

On the other hand, in order to reduce the power consumption as a whole, it is desired not to deteriorate the operational accuracy of the DA converter.

Accordingly, a first object of the present invention is to provide a DA converter that, without deteriorating the operation accuracy of the DA converter, can reduce the power consumption of a digital circuit portion thereof and as a result can reduce the power consumption as a whole.

Furthermore, a second object of the present invention is to provide a data reproducing apparatus that, without deteriorating the operation accuracy of the DA converter, can reduce the power consumption of the apparatus as a whole.

SUMMARY OF THE INVENTION

In order to overcome the above problems and to accomplish the first object, each of the respective inventions set forth below is constituted as follows.

That is, a first aspect of the invention is characterized in that in a Δ·Σ type DA converter includes a digital circuit that contains a PWM circuit; and an analog circuit that converts a PWM output value into an analog output value; wherein the Δ·Σ type converter has a first power supply that supplies a direct current voltage that is input into the analog circuit; and a second power supply that is set lower than the first power supply and supplies a direct current voltage that is input into the digital circuit; and a level shifter is interposed at an interface portion where the PWM output of the PWM circuit is input into the analog circuit, the level shifter steps up the PWM output in voltage and thereafter transfers it to the analog circuit.

Here, an operation of the invention according to the first aspect of the invention will be explained.

In a Δ·Σ type DA converter 10 shown in FIG. 1, between a PWM output of a digital circuit 5 and an analog circuit 7 that receives the PWM output, the PWM output is converted into an analog waveform that is obtained by connecting pulse heights that have values proportional to (voltage×time) of the PWM output, that is, (height×width=area) of rectangular portions in a pulse waveform shown in FIG. 2. Accordingly, when there is a variation in the power supply of the digital circuit 5, the voltage of the PWM output, that is, a pulse height h, varies, resulting in an adverse affect on the analog circuit 7.

Now, of the (height×width=area) of the rectangular portion in the pulse waveform of the PWM output, the pulse width, as far as there is no external noise such as jitter, has no relation with the variation of a power supply voltage VCCE. Accordingly, when a voltage corresponding to the height h (FIG. 2) of the pulse rectangular portion is stabilized or an adverse affect of the voltage variation can be eliminated, the operation accuracy of the DA converter 10 is not deteriorated.

That is, when the pulse width of the PWM output of the digital circuit is accurate, even when the pulse height h (FIG. 2) varies as the power supply of the digital circuit 5 varies, due to a voltage level-converting operation of a level shifter 11 interposed between the digital circuit 5 and the analog circuit 7 that receives the PWM output thereof, the analog circuit 7 is not adversely affected. Accordingly, the operation accuracy of the DA converter 10 is not deteriorated.

Being thus implemented, even with the power supply variation in the digital circuit 5, due to the power level-converting operation of the level shifter 11 that is interposed between the PWM output of the digital circuit 5 and the analog circuit 7 that receives the PWM output, the analog circuit 7 is not adversely affected, and the operation accuracy of the DA converter 10 is not deteriorated.

A second aspect of the invention is characterized in that, in the DA converter set forth in the first aspect of the invention, the digital circuit, the analog circuit and the level shifter are integrated on one semiconductor substrate.

A third aspect of the invention is characterized in that in a Δ·Σ type DA converter including a digital circuit containing a PWM circuit and an analog circuit that converts a PWM signal from the PWM circuit into an analog signal, in order to make an output of the analog circuit a predetermined value, the analog circuit is driven at a predetermined first direct current voltage, and the digital circuit is driven at a second direct current voltage lower than the first direct current voltage, and a level shifter is disposed at a boundary portion between the PWM circuit and the analog circuit, the level shifter steps up the PWM signal from the PWM circuit in voltage and outputs it to the analog circuit.

A fourth aspect of the invention is characterized in that, in the DA converter of the third aspect of the invention, the level shifter is driven at the first direct current voltage and the second direct current voltage.

A fifth aspect of the invention is characterized in that, in a DA converter set forth in the third or fourth aspect of the invention, the digital circuit includes a digital filter, a Δ·Σ modulator, and the PWM circuit.

A sixth aspect of the invention is characterized in that, in a DA converter set forth in any one of the third through fifth aspects of the invention, the analog circuit further includes a regulator that generates the second direct current voltage based on the first direct current voltage.

Thus, according to the respective third through sixth aspects of the invention, while noting that an analog circuit and a digital circuit have different characteristics, in order to make an output of the analog circuit a predetermined value, the analog circuit thereof is driven at a predetermined first direct current voltage and the digital circuit is driven at a second direct current voltage lower than the first direct current voltage. In addition, at a boundary portion between the PWM circuit and the analog circuit, the level shifter is interposed to step up a level of the PWM signal in voltage.

Accordingly, without deteriorating the operation accuracy of the DA converter, the power consumption of the digital circuit portion can be reduced, resulting in reducing the power consumption of the DA converter as a whole.

Next, in order to attain the second object of the present invention, each of next aspects of the invention is constituted as follows.

A seventh aspect of the invention is characterized in that a data reproducing apparatus includes; a Δ·Σ type DA converter having a first digital circuit containing a PWM circuit and an analog circuit that converts a PWM signal from the PWM circuit into an analog signal; and a second digital circuit constituted of a digital signal processing circuit that applies a predetermined digital signal process to a digital signal to be input into the Δ·Σ type DA converter; wherein in order to make an output of the analog circuit a predetermined value, the analog circuit thereof is driven at a predetermined first direct current voltage, and the first digital circuit and the second digital circuit are driven at a second direct current voltage lower than the first direct current voltage thereof; and a level shifter is interposed at a boundary portion between the PWM circuit and the analog circuit, the level shifter steps up the PWM signal from the PWM circuit in voltage and outputs it to the analog circuit.

An eighth aspect of the invention is characterized in that, in the data reproducing apparatus set forth in the seventh aspect of the invention, the level shifter is driven at the first direct current voltage and the second direct current voltage.

A ninth aspect of the invention is characterized in that, in the data reproducing apparatus set forth in the seventh or eighth aspect of the invention, the first digital circuit includes a digital filter, a Δ·Σ modulator, and the PWM circuit.

A tenth aspect of the invention is characterized in that, in the data reproducing apparatus set forth in any one of the seventh through ninth aspects of the invention, the analog circuit further includes a regulator that generates the second direct current voltage based on the first direct current voltage.

An eleventh aspect of the invention is characterized in that, in the data reproducing apparatus set forth in any one of the seventh through tenth aspects of the invention, the digital circuit, the analog circuit and the level shifter are integrated on one semiconductor substrate.

Thus, according to the respective seventh through eleventh aspects of the invention, in order to make an output of the analog circuit a predetermined value, the analog circuit thereof is driven at a predetermined first direct current voltage and the digital circuit is driven at a second direct current voltage lower than the first direct current voltage. In addition to this, at a boundary portion between the PWM circuit and the analog circuit, the level shifter is interposed to step up a voltage level of the PWM signal outputted from the PWM circuit and to output it to the analog circuit.

Accordingly, the operation accuracy of the Δ·Σ type DA converter is not deteriorated, and moreover, the power consumption of the digital circuit portion including the digital signal processing circuit preceding the DA conversion can be reduced, resulting in reducing the power consumption of the apparatus as a whole.

DETAILED DESCRIPTION OF THE PREFERRED EMBODIMENTS

In the following, with reference to the drawings, modes for carrying out the invention will be explained.

Figure 1:
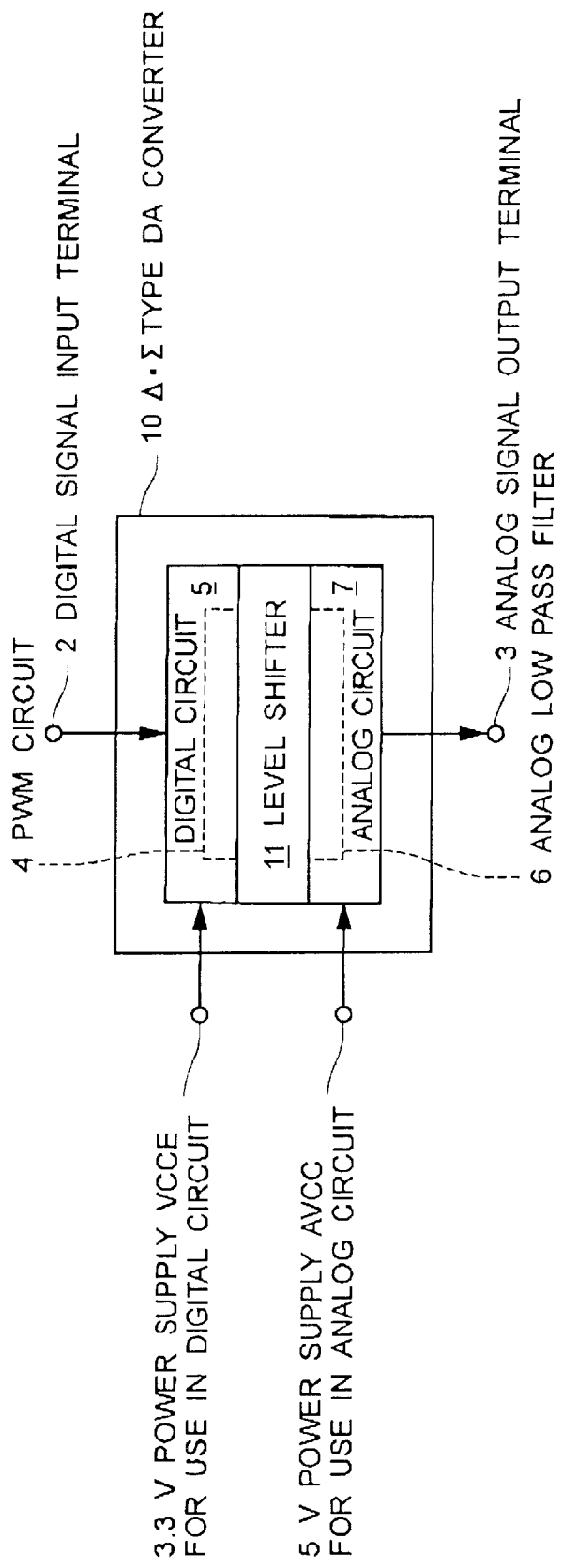
FIG. 1 is a block diagram showing a configuration of a first embodiment of a DA converter of the present invention.

A configuration of a first embodiment of a DA converter of the present invention will be explained with reference to FIG. 1.

A DA converter according to a first embodiment is a Δ·Σ type DA converter 10 in which a digital circuit 5 containing a PWM circuit 4 and an analog circuit 7 containing an analog low pass filter 6 are included, wherein when a digital signal is input from a digital signal input terminal 2, an analog signal is outputted from an analog signal output terminal 3.

Furthermore, the DA converter according to this first embodiment is configured so that the analog circuit 7 may be driven with a 5 V power supply AVCC and the digital circuit 5 that generates a control signal for controlling an operation of the analog circuit 7 may be operated with a 3.3 V power supply VCCE.

Still furthermore, at an interface portion (boundary portion) between the PWM circuit 4 and the analog circuit 7, a level shifter 11 is interposed. The level shifter 11 steps up in voltage the PWM signal (control signal) generated by use of the 3.3 V power supply in the digital circuit 5 and transmits it to the analog circuit 7.

Figure 2A:
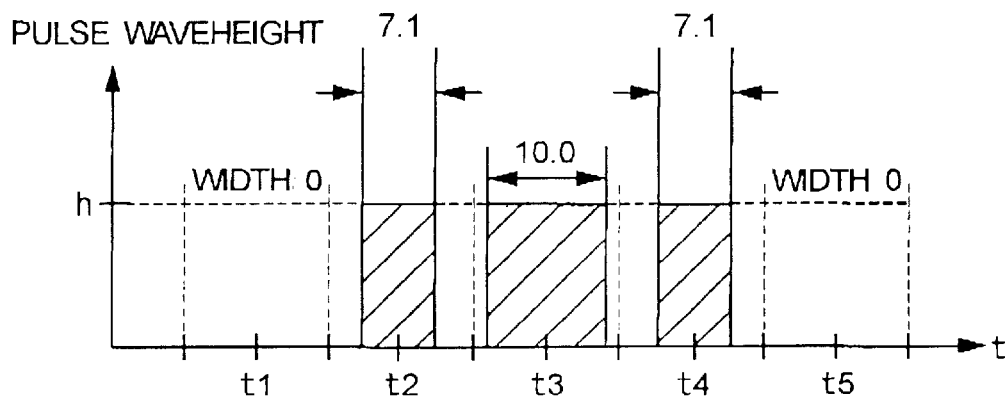
FIGS. 2A and 2B are explanatory diagrams of conversion of a PWM output into an analog waveform, FIG. 2A being a PWM waveform, FIG. 2B being an analog waveform.
Figure 2B:
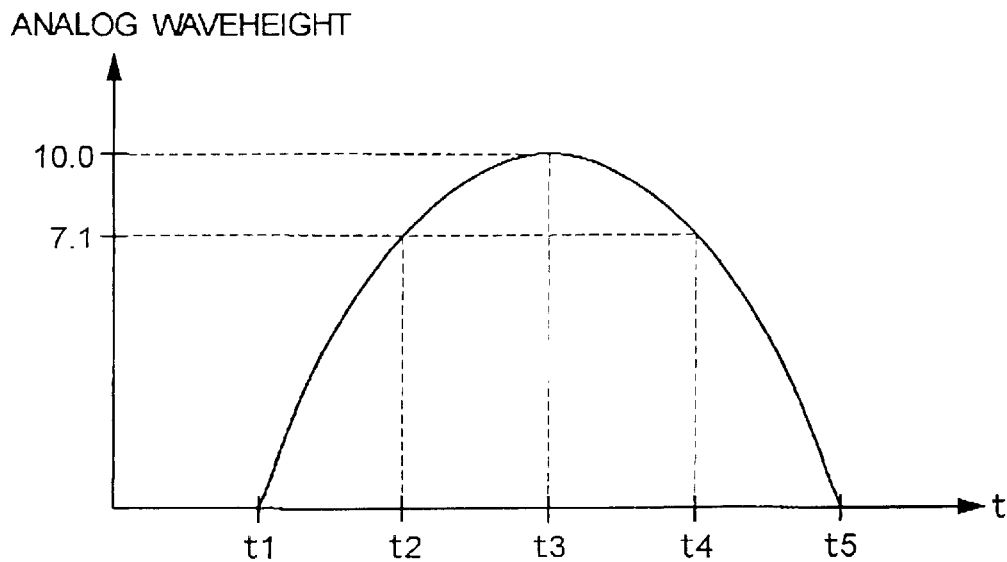

FIGS. 2A and 2B are explanatory diagrams for explaining the conversion of the PWM signal from the PWM circuit 4 into an analog waveform, FIG. 2A being a PWM waveform and FIG. 2B being an analog waveform.

In FIGS. 2A and 2B, as a presentation method of signal values to be transmitted at timings t1, t2, t3, t4 and t5 that are partitioned with a predetermined time interval, in FIG. 2A, pulses having widths proportional to the signal values are generated as PWM output values. That is, at t1, the width is zero, at t2 the width 7.1, at t3 the width 10, at t4 the width 7.1 and at t5 the width zero. Each product of these pulse widths and the pulse height h is plotted as an analog wave height at each of the timings followed by converting it into an analog waveform shown in FIG. 2B.

When the pulse height h is ideally set at 1, the analog wave height at t1 is zero, at t2 7.1, at t3 10, at t4 7.1 and at t5 zero. However, when the pulse height h varies to 1.1 at, for instance, t2, by multiplying 1.1 with 7.1, 7.81 results, similarly when the pulse height h varies to 0.9 at t4, by multiplying 0.9 with 7.1, 6.39 results. As a result, these values become the analog wave heights (not shown) deviated from 7.1 which is originally the same for t2 and t4. In comparison with the wave height h of the PWM output that varies in the range of 0.9 to 1.1, in the present invention, by disposing the level shifter 11, the pulse height h is accurately shifted to 5 so as to ward off the adverse effect of the power supply variation.

By implementing the forgoing, signal values to be originally transmitted can be accurately transmitted. Furthermore, in order to make a dynamic range and an output value larger, a level of an analog waveform (FIG. 2B) is said to be more advantageous as the voltage value is larger. Since the level of the analog waveform can be stepped up and set as high as desired depending on the level of the output voltage of the level shifter 11 and the voltage level of the power supply AVCC for use in the analog circuit, the degree of freedom in designing can be increased. On the contrary, to realize the same performance, the power supply VCCE for use in the digital circuit can be set as low as possible, for instance, at DC 1.8 V or so to the minimum. Thereby, the power consumption can be suppressed.

Next, a configuration of a second embodiment of a DA converter of the present invention will be explained with reference to FIG. 3.

A DA converter according to the second embodiment is a $\Delta\cdot\Sigma$ type DA converter provided with a digital circuit 21 and an analog circuit 22, wherein in order to make an output of the analog circuit 22 a predetermined value (predetermined level), the analog circuit 22 is driven at a predetermined direct current voltage V1 (for instance, 5 V), and the digital circuit 21 is driven at a direct current voltage V2 (for instance, 3.3V) that is set as lower as possible than the direct current voltage V1.

Furthermore, in the DA converter according to the second embodiment, since the digital circuit 21 and the analog circuit 22 are driven at different power supply voltages, at a boundary portion of the digital circuit 21 and the analog circuit 22, a level shifter 23 that performs level conversion of an output of the digital circuit 21 is interposed.

The digital circuit 21 includes a digital filter 24, a $\Delta\cdot\Sigma$ modulator 25 and a PWM circuit 26, wherein an input data that is input into an input terminal 27 is input in the digital filter 24, and a PWM signal is taken out of the PWM circuit 26 and supplied to the level shifter 23.

The digital filter 24, the $\Delta\cdot\Sigma$ modulator 25 and the PWM circuit 26 are configured so that these are driven at a direct current voltage V2 that is supplied from a power supply (not shown) to a power supply terminal 29. The direct current voltage V2 supplied to the power supply terminal 29 thereof is supplied through a power supply line 28 to the respective portions thereof.

Furthermore, the digital filter 24, the $\Delta\cdot\Sigma$ modulator 25 and the PWM circuit 26 are connected to a common ground line 30, the common connection portion is connected to a ground terminal 31, and the ground terminal 31 is grounded and used.

In digital circuit 21 thus configured, the digital filter 24, the $\Delta\cdot\Sigma$ modulator 25 and the PWM circuit 26 are constituted of, for instance, MOS transistors or the like, and are integrated on one single semiconductor substrate.

The level shifter 23 steps up a level of the PWM signal that is outputted from the PWM circuit 26 and outputs the stepped-up PWM signal to an analog filter 35 of the analog circuit 22.

The level shifter 23 is driven at, for instance, a direct current voltage V2 that drives the digital circuit 21 and a direct current voltage V1 that drives the analog circuit 22, and is provided with a power supply terminal 32 to which the direct current voltage V2 is supplied and a power supply terminal 33 to which the direct current voltage V1 is supplied. Furthermore, the level shifter 23 is provided with a ground terminal 34 and the ground terminal 34 is grounded and used.

The analog circuit 22 is provided with at least an active analog filter 35. The analog filter 35 includes an active low pass filter (LPF) that is constituted of an operational amplifier and so on. The analog filter 35 converts the PWM signal that is stepped up in voltage at the level shifter 23 to an analog signal, and the converted analog signal is outputted from an output terminal 36.

The analog filter 35 is driven with the direct current voltage V1 and provided with a power supply terminal 37 to which the direct current voltage V1 is supplied. Furthermore, the analog filter 35 is provided with a ground terminal 38, and the ground terminal 38 is grounded and used.

As mentioned above, in the second embodiment, in order to make an output of the analog circuit 22 a predetermined value, the analog circuit 22 is driven at the predetermined direct current voltage V1, and the digital circuit 21 is driven at the direct current voltage V2 that is set as low as possible relative to the direct current voltage V1, and at a boundary portion of the PWM circuit 26 and the analog circuit 22, the level shifter 23 that performs level conversion of an output of the PWM circuit 26 is interposed.

Accordingly, according to the second embodiment, without deteriorating the operation accuracy as the $\Delta\cdot\Sigma$ type DA converter, the power consumption of the digital circuit 21 portion can be reduced, resulting in reducing the power consumption as a whole.

In the second embodiment, each of the digital circuit 21, the level shifter 23 and the analog circuit 22 is independently constituted. However, instead of this, the digital circuit 21, the level shifter 23 and the analog circuit 22 may be integrated on one semiconductor substrate.

Next, a third embodiment of a DA converter according to the present invention will be explained with reference to FIG. 4.

A DA converter according to the third embodiment is a $\Delta\cdot\Sigma$ type DA converter provided with a digital circuit 41 and an analog circuit 42, wherein in order to make an output of the analog circuit 42 a predetermined value, the analog circuit 42 is driven at a predetermined direct current voltage V1 (for instance, 5 V) supplied from a power supply (not shown), and the digital circuit 41 is driven at a direct current voltage V2 (for instance, 3.3V) that is set as low as possible relative to the direct current voltage V1 and outputted from a regulator 44 contained in the analog circuit 42.

Furthermore, in the DA converter according to the third embodiment, since the digital circuit 41 and the analog circuit 42 are driven at different power supply voltages, at a boundary portion of the digital circuit 41 and the analog circuit 42, a level shifter 43 that performs level conversion of an output of the digital circuit 41 is interposed.

Still furthermore, in the DA converter according to the third embodiment, the digital circuit 41, the analog circuit 42, the level shifter 43 are constituted of MOS transistor and so on and are integrated on one semiconductor substrate.

Figure 3:
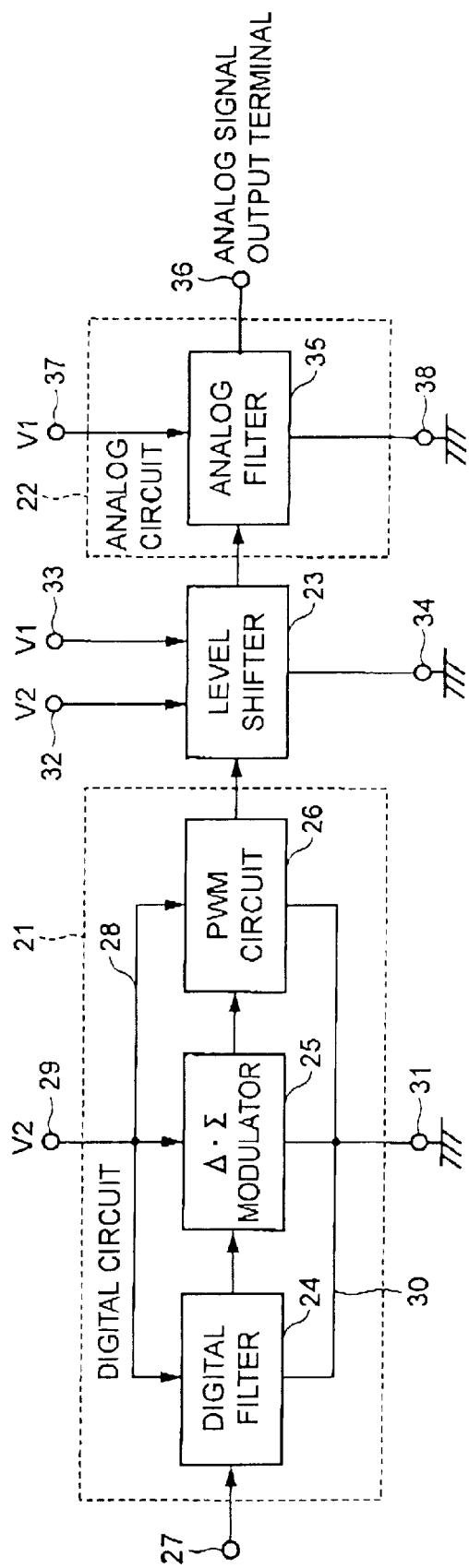
FIG. 3 is a block diagram showing a configuration of a second embodiment of a DA converter of the present invention.

The digital circuit 41, similar to the digital circuit 21 shown in FIG. 3, includes a digital filter 24, a $\Delta\cdot\Sigma$ modulator 25 and a PWM circuit 26, wherein an input data that is supplied to an input terminal 45 is input into the digital filter 24, and a PWM signal is taken out of the PWM circuit 26 and supplied to the level shifter 43.

The digital filter 24, the $\Delta\cdot\Sigma$ modulator 25 and the PWM circuit 26 are configured so that these are driven with a direct current voltage V2 that is supplied from an output side of the regulator 44. Accordingly, the direct current voltage V2 is supplied through a low voltage power supply line 46 to the respective portions thereof.

Furthermore, the digital filter 24, the Δ·Σ modulator 25 and the PWM circuit 26 are connected to a common ground line 47, the common connection portion is connected to a ground terminal 48, and the ground terminal 48 is grounded and used.

The level shifter 43 steps up a voltage level of the PWM signal outputted from the PWM circuit 26, and the stepped-up PWM signal is outputted to the analog filter 35 of the analog circuit 42.

The level shifter 43 is configured to be driven with, for instance, a direct current voltage V2 that drives the digital circuit 41 and a direct current voltage V1 that drives the analog circuit 42, wherein the direct current voltage V2 is supplied through the low voltage power supply line 46 and the direct current voltage V1 is supplied through a high voltage power supply line 49. Furthermore, the level shifter 43 is connected through the ground line 47 to the ground terminal 48.

The analog circuit 42 is provided with at least an active analog filter 35 and a regulator 44. The analog filter 35 includes an active low pass filter (LPF), converts the PWM signal that is stepped-up at the level shifter 43 into an analog signal, and the converted analog signal is outputted from an output terminal 50.

The analog filter 35 is configured to be driven with a direct current voltage V1 supplied to a power supply 51, and is connected through the high voltage power supply line 49 to the power supply terminal 51. Furthermore, the analog filter 35 is connected through the ground line 47 to the ground terminal 48.

The regulator 44 converts a direct current voltage V1 supplied from a power supply (not shown) to a direct current voltage V2 lower than the direct current voltage V1 and outputs it, and stabilizes an output voltage thereof.

In the case of the regulator 44 being configured to have large output impedance, a power supply voltage of the digital circuit 41 that is an output voltage of the regulator 44 varies (decreases). However, since the level shifter 43 operates similarly to the level shifter 11 shown in FIG. 1, the adverse affects of variations of the output voltage of the regulator 44 can be reduced.

As mentioned above, in the third embodiment, in order to make an output of the analog circuit 42 a predetermined value, the analog circuit 42 is driven at a predetermined direct current voltage V1, and the digital circuit 41 is driven at a direct current voltage V2 that is set as low as possible relative to the direct current voltage V1, and at a boundary portion of the PWM circuit 26 and the analog circuit 42, the level shifter 43 that performs level conversion of an output of the PWM circuit 26 is interposed.

Accordingly, according to the third embodiment, without deteriorating the operation accuracy as the Δ·Σ type DA converter, the power consumption of the digital circuit 41 portion can be reduced, resulting in reducing the power consumption as a whole.

Next, a configuration of an embodiment of data reproducing apparatus according to the present invention will be explained with reference to FIG. 5.

Figure 4:
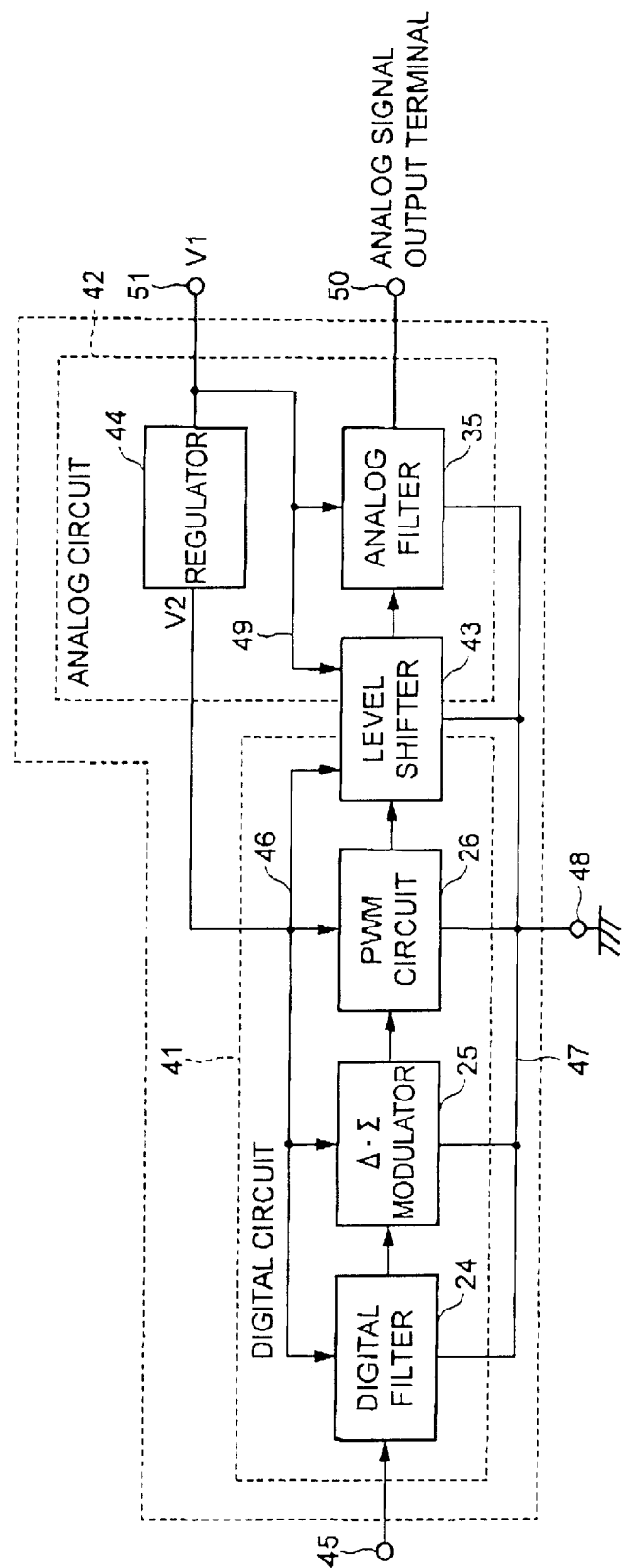
FIG. 4 is a block diagram showing a configuration of a third embodiment of a DA converter of the present invention.

Data reproducing apparatus according to the embodiment applies a predetermined digital signal processing to data optically read from data recorded on a recording medium such as, for instance, a CD (compact disc), thereafter converts digital signals into analog signals by use of the Δ·Σ type DA converter as shown in FIG. 4, and reproduces audio signals based on the converted analog signal with a speaker or a headphone.

Figure 5:
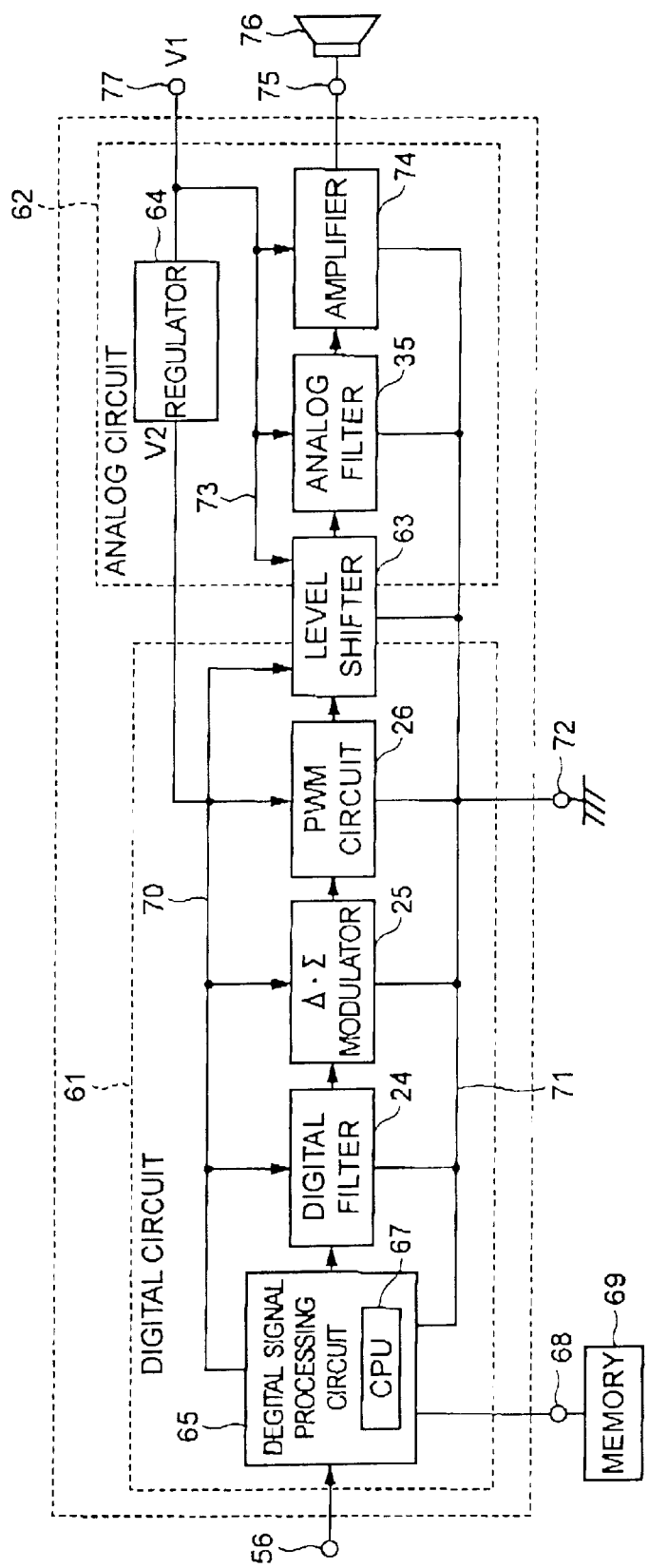
FIG. 5 is a block diagram showing a configuration of an embodiment of data reproducing apparatus of the present invention.

Accordingly, the data reproducing apparatus according to this embodiment, as shown in FIG. 5, is provided with a digital circuit 61 and an analog circuit 62, and in order to make an output of the analog circuit 62 a predetermined value, the analog circuit 62 is driven at a predetermined direct current voltage V1 (for instance, 5V) supplied from a power supply (not shown), and the digital circuit 61 is driven at a direct current voltage V2 (for instance, 3.3 V) that is set as low as possible relative to the direct current voltage V1 and outputted from a regulator 64 contained in the analog circuit 62.

Furthermore, in the data reproducing apparatus according to this embodiment, since the digital circuit 61 and the analog circuit 62 are driven at different power supply voltages, at a boundary portion of the digital circuit 61 and the analog circuit 62, a level shifter 63 that performs level conversion of an output of the digital circuit 61 is interposed.

Still furthermore, in the data reproducing apparatus according to this embodiment, the digital circuit 61, the analog circuit 62, and the level shifter 63 are constituted of MOS transistors and so on and integrated on one semiconductor substrate.

The digital circuit 61, similarly to the digital circuit 41 shown in FIG. 4, includes a digital filter 24, a Δ·Σ modulator 25 and a PWM circuit 26, and further includes a digital signal processing circuit 65 at an input side of the digital filter 24.

The digital circuit 61 includes a first digital circuit that includes the digital filter 24, the Δ·Σ modulator 25 and the PWM circuit 26, and partially constitutes the Δ·Σ type DA converter, and a second digital circuit constituted of the digital signal processing circuit 65.

The digital data processing circuit 65 is a circuit where preceding the DA conversion, a predetermined digital signal process (for instance, error correction) is applied to data optically read from data recorded in a recording medium such as a CD, and a predetermined input data is input through an input terminal 66.

The digital signal processing circuit 65 includes, for instance, a CPU 67, and when an external memory 69 is connected to a memory connection terminal 68, the circuit 65 allows sending and receiving data between the CPU 67 and the memory 69.

The digital signal processing circuit 65, the digital filter 24, the Δ·Σ modulator 25 and the PWM circuit 26 are configured so that these are driven with a direct current voltage V2 that is outputted from the regulator 64. For this purpose, the direct current voltage V2 is supplied through a low voltage power supply line 70 to the respective portions thereof.

Furthermore, the digital signal processing circuit 65, the digital filter 24, the Δ·Σ modulator 25 and the PWM circuit 26 are connected to a common ground line 71, the common connection portion thereof is connected to a ground terminal 72, and the ground terminal 72 is grounded and used.

The level shifter 63 steps up a level of the PWM signal outputted from the PWM circuit 26, and the stepped-up PWM signal is outputted to the analog filter 35 of the analog circuit 62.

The level shifter 63 is configured to be driven with, for instance, a direct current voltage V2 that drives the digital circuit 61 and a direct current voltage V1 that drives the analog circuit 62, wherein the direct current voltage V2 is supplied through the low voltage power supply line 70 and the direct current voltage V1 is supplied through a high voltage power supply line 73. Furthermore, the level shifter 63 is connected through the ground line 71 to the ground terminal 72.

The analog circuit 62 is provided with at least an active analog filter 35, an amplifier 74 and a regulator 64.

The analog filter 35 is constituted of an active low pass filter (LPF), converts the PWM signal stepped-up at the level shifter 63 into an analog signal, and supplies the converted analog signal to the amplifier 74. The amplifier 74 amplifies the analog signal supplied from the analog filter 35 and drives a speaker 76 connected to an output terminal 75.

The analog filter 35 and the amplifier 74 are configured to be driven with a direct current voltage V1 supplied to a power supply terminal 77, and are connected through the high voltage power supply line 73 to the power supply terminal 77. Furthermore, the analog filter 35 and the amplifier 74 are connected through the ground line 71 to the ground terminal 72.

The regulator 64 converts a direct current voltage V1 supplied from a power supply (not shown) into a direct current voltage V2 lower than the direct current voltage V1 and outputs it, and stabilizes an output voltage thereof.

In the case of the regulator 64 being configured to have large output impedance, a power supply voltage of the digital circuit 61 that is an output voltage thereof varies (decreases). However, since the level shifter 63 operates similarly to the level shifter 11 shown in FIG. 1, the adverse affects of variations of the output voltage of the regulator 64 can be reduced.

As mentioned above, in this embodiment, in order to make an output of the analog circuit 62 a predetermined value, the analog circuit 62 is driven at a predetermined direct current voltage V1 supplied from a power supply (not shown), and the digital circuit 61 is driven at a direct current voltage V2 that is set as low as possible relative to the direct current voltage V1, and at a boundary portion of the PWM circuit 26 and the analog circuit 62, the level shifter 63 that performs level conversion of an output of the PWM circuit 26 is interposed.

According to this embodiment, the operation accuracy of the Δ·Σ type DA converter is not deteriorated, and moreover the power consumption of the digital circuit 61 portion including the digital signal processing circuit 65 preceding the DA conversion can be reduced, resulting in reducing the power consumption of the apparatus as a whole.

In the above embodiment, the digital circuit 61, the level shifter 63 and the analog circuit 62 are integrated on one semiconductor substrate. However, instead of this, the digital circuit 61, the level shifter 63 and the analog circuit 62 may be separately integrated on different semiconductor substrates and may form three components.

As mentioned above, according to the DA converter of the present invention, without deteriorating the operation accuracy of the Δ·Σ type DA converter, the power consumption of the digital circuit portion can be reduced, and thereby the power consumption of the DA converter as a whole can be reduced.

According to the reproducing apparatus of the present invention, the operation accuracy of the Δ·Σ type DA converter is not deteriorated, and moreover the power consumption of the digital circuit portion containing the digital signal processing circuit prior to the DA conversion process can be reduced, and thereby the power consumption of the apparatus as a whole can be reduced.

The entire disclosure of Japanese Patent Application Nos. 2001-334611 filed Oct. 31, 2001 and 2002-308309 filed Oct. 23, 2002 are incorporated by reference.

What is claimed is:

1. A Δ·Σ DA converter comprising:
   a digital circuit containing a PWM circuit and an analog circuit that converts a PWM output value into an analog output value;
   a first power supply that supplies a first direct current voltage that is input in the analog circuit;
   a second power supply that is set at a value lower than the first power supply and supplies a second direct current voltage that is input in the digital circuit; and
   a regulator that converts the first direct current voltage to the second direct current voltage;
   wherein a level shifter is interposed at an interface portion where the PWM output of the PWM circuit is input in the analog circuit, the level shifter stepping up the PWM output in voltage and thereafter transfers the output to the analog circuit.

2. The DA converter as set forth in claim 1:
   wherein the digital circuit, the analog circuit, the level shifter, and the regulator are integrated on one semiconductor substrate.

3. In a Δ·Σ type DA converter including a digital circuit containing a PWM circuit and an analog circuit that converts a PWM signal from the PWM circuit into an analog signal, a method of making an output of the analog circuit a predetermined value comprising:
   driving the analog circuit at a predetermined first direct current voltage;
   converting the predetermined first direct current voltage to a second direct current voltage lower than the first direct current voltage;
   driving the digital circuit at the second direct current voltage; and
   stepping up the PWM signal from the PWM circuit in voltage and outputting the PWM signal to the analog circuit with a level shifter disposed at a boundary portion between the PWM circuit and the analog circuit.

4. The method as set forth in claim 3:
   wherein the level shifter is driven at the first direct current voltage and the second direct current voltage.

5. The method as set forth in claim 3:
   wherein the digital circuit includes a digital filter, a Δ·Σ modulator, and the PWM circuit.

6. A data reproducing apparatus comprising:
   a Δ·Σ type DA converter including a first digital circuit containing a PWM circuit and an analog circuit that converts a PWM signal from the PWM circuit into an analog signal; and
   a second digital circuit constituted of a digital signal processing circuit that applies a predetermined digital signal processing to a digital signal to be input into the Δ·Σ type DA converter;
   wherein in order to make an output of the analog circuit a predetermined value, the analog circuit is driven at a predetermined first direct current voltage, and the first digital circuit and the second digital circuit are driven at a second direct current voltage lower than the first direct current voltage; and a level shifter is disposed at a boundary portion between the PWM circuit and the analog circuit, the level shifter stepping up the PWM signal from the PWM circuit in voltage and outputs the PWM signal to the analog circuit;

a regulator that converts the first direct current voltage to the second direct current voltage.

7. The data reproducing apparatus as set forth in claim 6:

wherein the level shifter is driven at the first direct current voltage and the second direct current voltage.

8. The data reproducing apparatus as set forth in claim 6:

wherein the first digital circuit includes a digital filter, a $\Delta\cdot\Sigma$ modulator, and the PWM circuit.

9. The data reproducing apparatus as set forth in claim 6:

wherein the digital circuit, the analog circuit, the level shifter, and the regulator are integrated on one semiconductor substrate.

* * * * *